United States Patent
Midya (10) Patent No.: US 6,236,837 B1
(45) Date of Patent: May 22, 2001

(54) POLYNOMIAL PREDISTORTION LINEARIZING DEVICE, METHOD, PHONE AND BASE STATION

(75) Inventor: Pallab Midya, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/126,138

(22) Filed: Jul. 30, 1998

(51) Int. Cl.[7] .................................................. H04B 15/00
(52) U.S. Cl. ........................ 455/63; 330/149; 375/296; 375/297
(58) Field of Search ..................... 455/63, 126; 330/149; 375/296, 297

(56) References Cited

U.S. PATENT DOCUMENTS

| | | |
|---|---|---|
| 5,023,937 | 6/1991 | Opas . |
| 5,049,832 | 9/1991 | Cavers . |
| 5,107,520 * | 4/1992 | Karam et al. .......................... 455/126 |
| 5,164,678 | 11/1992 | Puri et al. . |
| 5,430,416 | 7/1995 | Black et al. . |
| 5,524,285 | 6/1996 | Wray et al. . |
| 5,900,778 * | 5/1999 | Stonick et al. ........................ 330/149 |

OTHER PUBLICATIONS

Cavers, James K., "Adaptation Behavior of a Feedforward Amplifier Linearizer" IEEE Transactions on Vehicular Technology, vol. 44, No. 1, Feb. 1995.

Mushtaq A. Syed and V. John Mathews, "QR-Decomposition Based Algorithms for Adaptive Volterra Filtering", IEEE Transactions on Circuits and Systems—1: Fundamental Theory and Applications, vol. 40, No. 6, Jun. 1993. pp. 372–382.

S.W. Nam, S.B. Kim, and E.J. Powers, "On the Identification of a Third–Order Volterra Nonlinear System Using a Frequency–Domain Block RLS Adaptive Algorithm", 1990 IEEE, CH2847–2/90/0000–2407. pp2407–2410.

Hyun Woo Kang, Yong Soo Cho, and Dae Hee Youn, "An Efficient Adaptive Predistorter for Nonlinear High Power Amplifier in Satellite Communication", 1997 IEEE International Symposium on Circuits and Systems, Jun. 9–12, 1997, Hong Kong. pp 2288–2291.

Murali Tummla, Michael T. Donovan, Bruce E. Watkins, and Richard North, "Volterra Series Based Modeling and Compensation of Nonlinearties in High Power Amplifiers", 1997 IEEE, 0–8186–7919–0/97. pp. 2417–2420.

Clarkson, Peter M. "Optimal and Adaptive Signal Processing" Electronic Engineering Systems Series, CRC Press pp. 155–173.

Leehter Yao, William A. Sethares and Yu–Hen Hu "Identification of a Nonlinear System Modeled by a Sparse Volterra Series" 1992 IEEE, 92CH3179–9/92. pp. 624–627.

* cited by examiner

Primary Examiner—Lee Nguyen
(74) Attorney, Agent, or Firm—Douglas D. Fekete (57) ABSTRACT

A device (400), method (1200), phone (400) and base station (400) provide predistortion for linearization in a radio frequency RF power amplifier. The method includes the steps of: A) predistorting (1201) a baseband signal to provide a predistorted baseband signal in accordance with real-time polynomial coefficients; B) modulating (1202) the predistorted baseband signal to provide an RF signal; C) amplifying (1203) the RF signal to provide an amplified RF signal; D) demodulating (1204) the amplified RF signal to provide a demodulated baseband signal; and E) estimating (1205) the real-time polynomial coefficients to provide a linear amplified RF signal.

23 Claims, 7 Drawing Sheets

POLYNOMIAL PREDISTORTION LINEARIZING DEVICE, METHOD, PHONE AND BASE STATION

FIELD OF THE INVENTION

The present invention relates to linearization of radio frequency (RF) power amplifiers (PAs) and more particularly to predistortion linearization of RF power amplifiers.

BACKGROUND OF THE INVENTION

Linearization of RF power amplifiers results in reduced signal distortion and reduced spectral growth of the RF output. Predistortion is a technique for distorting the input signal to the PA. This distortion is carefully chosen to be the inverse of the PA distortion such that the signal at the output of the PA is undistorted, The distortion is a function of the devices in the PA, their nonlinear behavior, their temperature and load mismatch. In order to linearize a PA it is necessary to estimate the nonlinearity accurately. This estimation must be performed continuously or updated periodically. To linearize the PA it is necessary to use the nonlinearity estimation data in a linearization algorithm.

The linearization algorithm must have relatively low computational requirements without compromising accuracy. This invention performs linearization with medium or high accuracy depending on the application. The computational requirements are extremely low.

Figure 1:
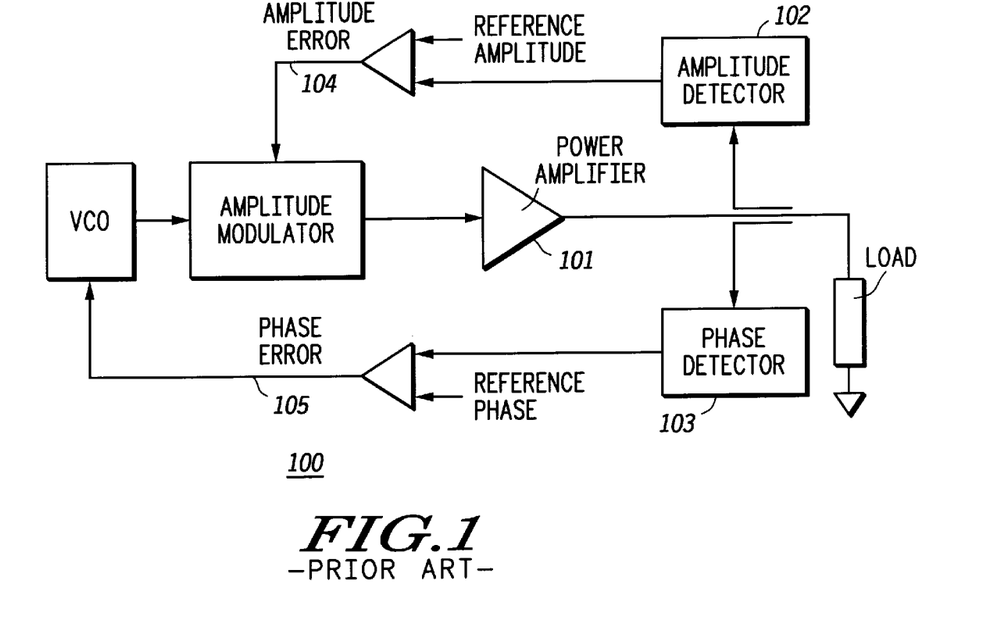
FIG. 1 is a block diagram of a polar feedback system for linearization as is known in the art.
Figure 2:
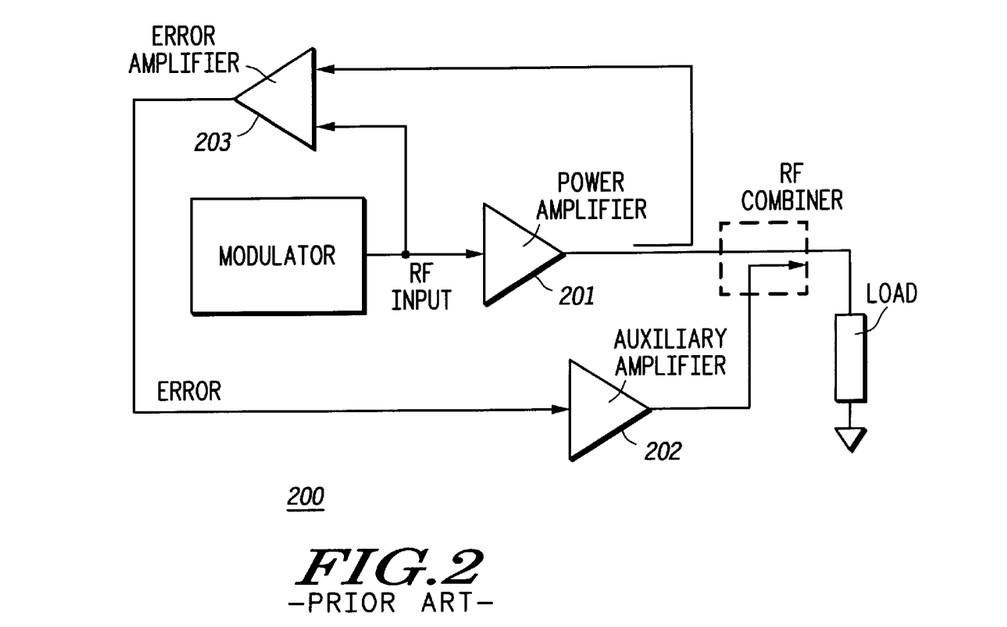
FIG. 2 is a block diagram of a feedforward system for linearization as is known in the art.

Linearization of PAs have been attempted in the prior art. FIG. 1, numeral 100, is a block diagram of a polar feedback scheme for linearization as is known in the art. FIG. 2, numeral 200, is a block diagram of a feedforward scheme for linearization as is known in the art.

Figure 3:
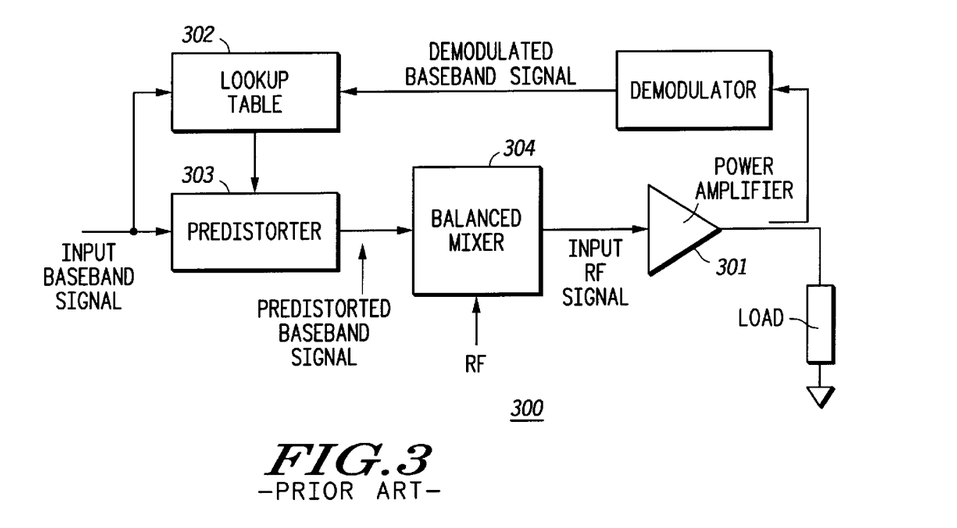
FIG. 3 is a block diagram of a lookup table system for linearization as is known in the art.

FIG. 3, numeral 300, is a block diagram of a lookup table scheme for linearization as is known in the art. The RF signal at the output of the PA is demodulated and the in-phase and quadrature (I and Q) components of the output signal are detected. A feedback scheme or a lookup table is used to drive the error in the two signals to zero. Generation of the I and Q signals and the error cancellation constitute a complex process which is not justified in low cost systems. Other prior art includes analog feedforward correction, and use of amplitude and phase feedback loops. A popular technique for digital predistortion scheme is the predistortion lookup table approach in Cartesian coordinates. The amplifier input-output nonlinear relationship is mapped and its inverse is stored. For any given I and Q input signals the required predistortion for both signals is calculated. In the normal mode of operation the predistortion is done by using the lookup table. The table is usually constructed during a dedicated training period for the algorithm. There are related techniques where the lookup table is updated continuously.

There are numerous analog predistortion schemes where a nonlinear element like a diode is used for introducing a distortion to cancel the distortion in the amplifier. These have the benefit of high bandwidth, simplicity but are subject to significant errors due to component tolerance and/or limited cancellation. The more precise versions include a variable attenuator for providing the amplitude predistortion and a PLL for phase predistortion. These schemes operate with separate feedback loops for amplitude and phase control. While the bandwidth and stability of the loops poses a challenge for many applications, it is an appropriate method for PA linearization.

There are feedforward schemes that have been proposed where the parameters are tuned slowly and the feedforward nature allows fast response. However the correction in the schemes of prior art requires an additional class A amplifier to supplement the RF signal. This adds complexity to the RF circuitry and reduces efficiency.

Optimally, the linearization must have relatively low computational requirements without compromising accuracy. Thus, there is a need for a polynomial predistortion linearizer and method for performing power amplifier linearization with medium or high accuracy depending on the application while minimizing the computational requirements.

DETAILED DESCRIPTION OF A PREFERRED EMBODIMENT

Estimation of the nonlinearity of a power amplifier is a system estimation problem. By contrast, the linearization of the power amplifier is a system linearization problem. Any system linearization problem can be solved only with knowledge of the nonlinearity. This falls in the category of a system estimation problem. After the system nonlinearity is estimated, there remains the problem of converting this information into a form that can be used for linearization. This is a system linearization problem. Both have been solved in a novel manner in the present invention.

Figure 4:
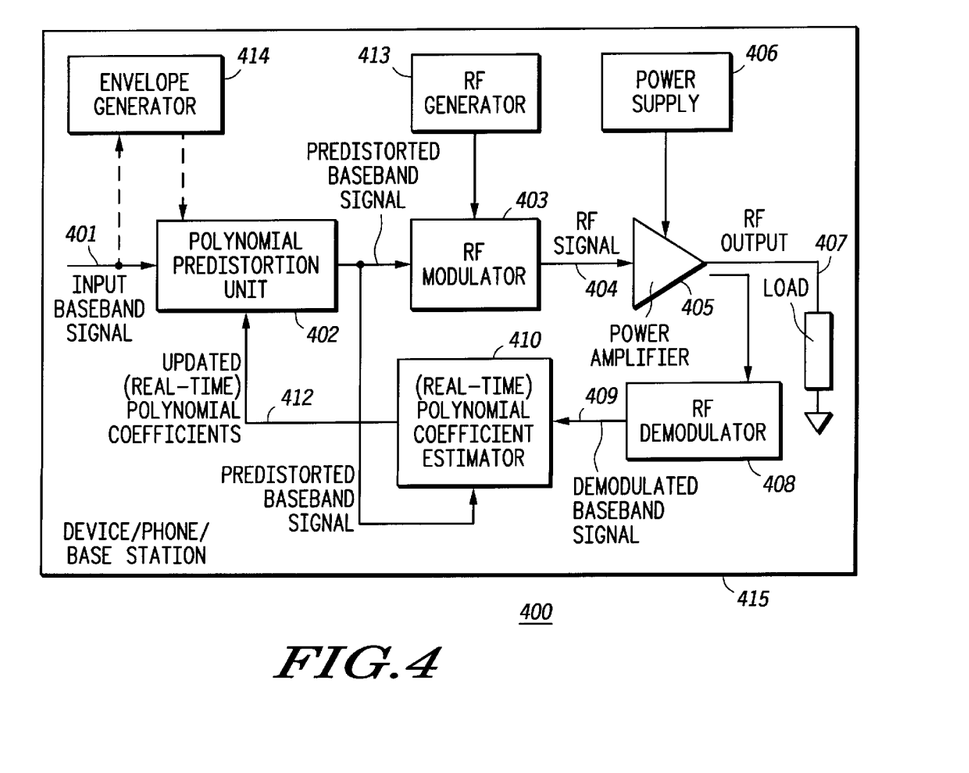
FIG. 4 is a block diagram of one embodiment of a device for implementing a polynomial predistortion scheme in accordance with the present invention.

FIG. 4, numeral 400, is a block diagram of one embodiment of a device for implementing a polynomial predistortion scheme in accordance with the present invention. The device (400) is used for providing predistortion for linearization in a radio frequency RF power amplifier. The device (400) includes: A) a polynomial predistortion unit (402), coupled to receive an input baseband signal and updated polynomial coefficients, for predistorting the baseband signal to provide a predistorted baseband signal in accordance with the updated polynomial coefficients, B) an RF modulator (403), coupled to the polynomial predistortion unit (402) and to an RF generator (413), for modulating the predistorted baseband signal to provide an RF signal; C) an RF power amplifier (405), coupled to the RF modulator (403) and to a power supply (406), for amplifying the RF signal to provide an amplified RF signal; D) an RF demodulator (408), coupled to receive the amplified RF signal, for demodulating the amplified RF signal to provide a demodulated baseband signal; and E) a polynomial coefficient estimator (410), coupled to receive the predistorted baseband signal and the demodulated baseband signal, for estimating the polynomial coefficients to provide updated polynomial coefficients for the polynomial predistortion unit (402) for substantially linearizing the amplified RF signal. Voltage of the power supply may be selected to be a function of the baseband signal. In a preferred embodiment the polynomial coefficient estimator uses orthogonal polynomial basis functions. Where selected, the device may further include an envelope generator (414), coupled to receive an input baseband signal, for computing an envelope of the input baseband signal and providing the envelope of the input baseband signal to the polynomial predistortion unit (402). The real-time polynomial coefficient estimator implements the polynomial update scheme described more fully below.

Clearly, the device of the present invention may be utilized in a phone (400) or base station (400) to provide the flexibility of real-time linearization of RF amplified signals.

Also, the device of the present invention for providing predistortion for linearization in a radio frequency RF power amplifier, may include: A) a polynomial predistortion unit (402), coupled to receive an input baseband signal and updated real-time polynomial coefficients, for predistorting the input baseband signal to provide a predistorted baseband signal in accordance with the updated real-time polynomial coefficients; B) an RF modulator (403), coupled to the polynomial predistortion unit (402) and to an RF generator (413), for modulating the predistorted baseband signal to provide an RF signal; C) an RF power amplifier (405), coupled to the RF modulator (403) and to a power supply (406), for amplifying the RF signal to provide an amplified RF signal; D) an RF demodulator (408), coupled to receive the amplified RF signal, for demodulating the amplified RF signal to provide a demodulated baseband signal; and E) a real-time polynomial coefficient estimator (410), coupled to receive the predistorted baseband signal and the demodulated baseband signal, for estimating the real-time polynomial coefficients to provide updated real-time polynomial coefficients that predistort the input baseband signal to adjust the amplified RF signal to be substantially linear. Again, the voltage of the power supply may be a function of the input baseband signal, and the real-time polynomial coefficients are typically estimated using orthogonal polynomial basis functions.

Figure 5:
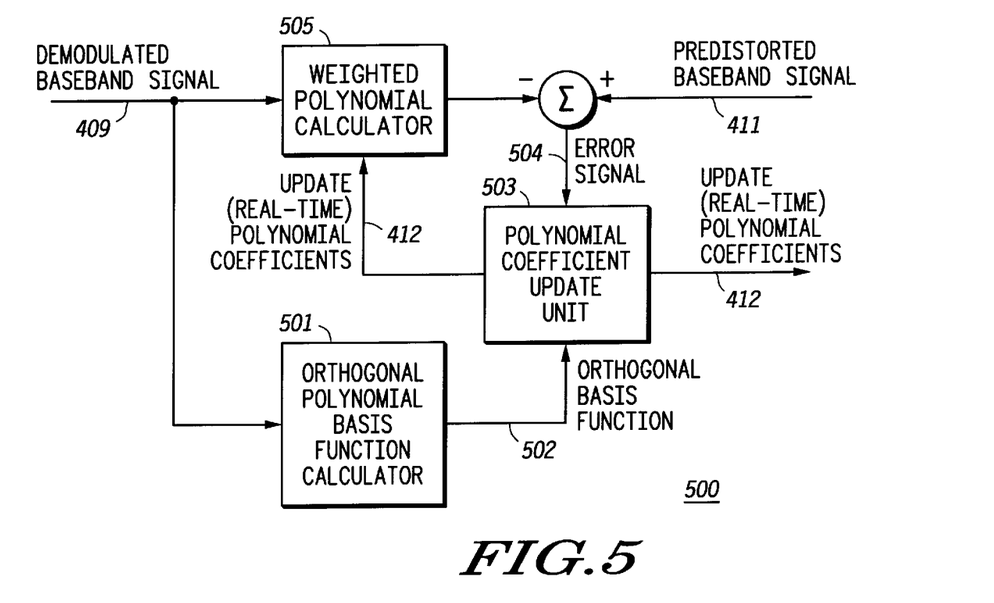
FIG. 5 is a block diagram of one embodiment of a polynomial coefficient estimator of FIG. 4.

FIG. 5, numeral 500, is a block diagram of one embodiment of a polynomial coefficient estimator (410) of FIG. 4, The real-time polynomial coefficient estimator (410) of the present invention generally includes: A) an orthogonal basis function calculator (501), coupled to receive the demodulated baseband signal, for computing orthogonal polynomial basis functions of the demodulated baseband signal; B) a polynomial coefficient update unit (503), coupled to the orthogonal basis function calculator (501) and to receive an error signal, for computing updated polynomial coefficients; C) a weighted polynomial calculator (505), coupled to receive the demodulated baseband signal and to the polynomial coefficient update unit, for calculating a weighted polynomial of the demodulated baseband signal; and D) a combiner (504), coupled to the weighted polynomial calculator (505) and to receive the predistorted baseband signal, for computing the error signal.

Figure 6:
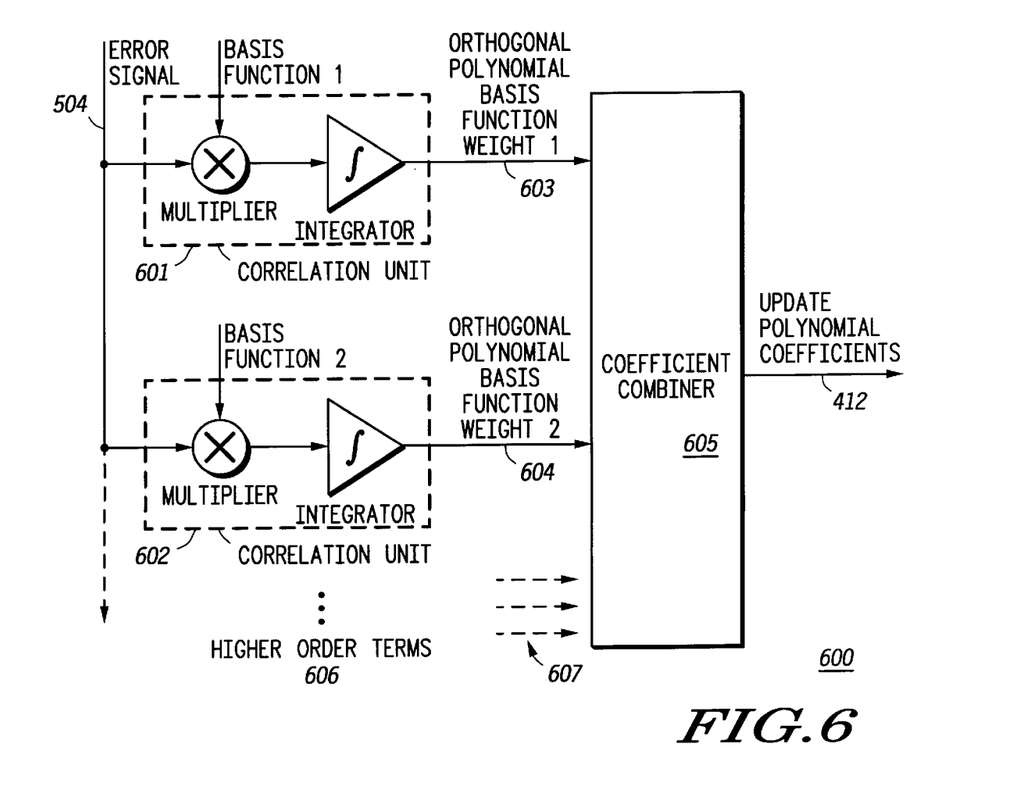
FIG. 6 is a schematic of an embodiment of the polynomial coefficient update unit of FIG. 5.

As shown in FIG. 6, numeral 600, a schematic of an embodiment of the polynomial coefficient update unit (503) of FIG. 5, the polynomial coefficient update unit (503) may include: A) a plurality of correlation units (601, 602, . . . , 606), each correlation unit coupled to receive the error signal and one of the orthogonal polynomial basis functions, for determining weights, wherein each weight is associated with each corresponding orthogonal polynomial basis function, and B) a coefficient combiner (605), coupled to the plurality of correlation units (601, 602, . . . ,606), for combining the weights to provide the updated polynomial coefficients.

The nonlinearity of a radio frequency PA typically does not significantly depend on the previous signals to the amplifier, but rather on the present input to it. This kind of a nonlinearity can be modeled as a memoryless nonlinearity. Here, a scalar memoryless system is considered as a starting point. However, a PA has a complex input: amplitude and phase, or In-phase and Quadrature; and the scalar case has to be generalized to accommodate the complex signal.

Consider a zero memory, scalar, nonlinear system whose input and output are measurable. The output y is a polynomial of order n of the input x. The polynomial coefficients are not known. Thus, it is the objective of the algorithm/scheme of the present invention to evaluate the polynomial coefficients. The input-output relationship is as follows.

$$y = \sum_{i=0}^{n-1} a_i(x)^i \tag{1}$$

The coefficients $a_i$ are real constants but unknown. This algorithm evaluates them from measured values of x and y. The probability density function of x is known apriori. Define a polynomial basis function $b_i$ such that it is of the form.

$$b_i(x) = \sum_{j=0}^{i} c_{ij}(x)^j \tag{2}$$

Figure 7:
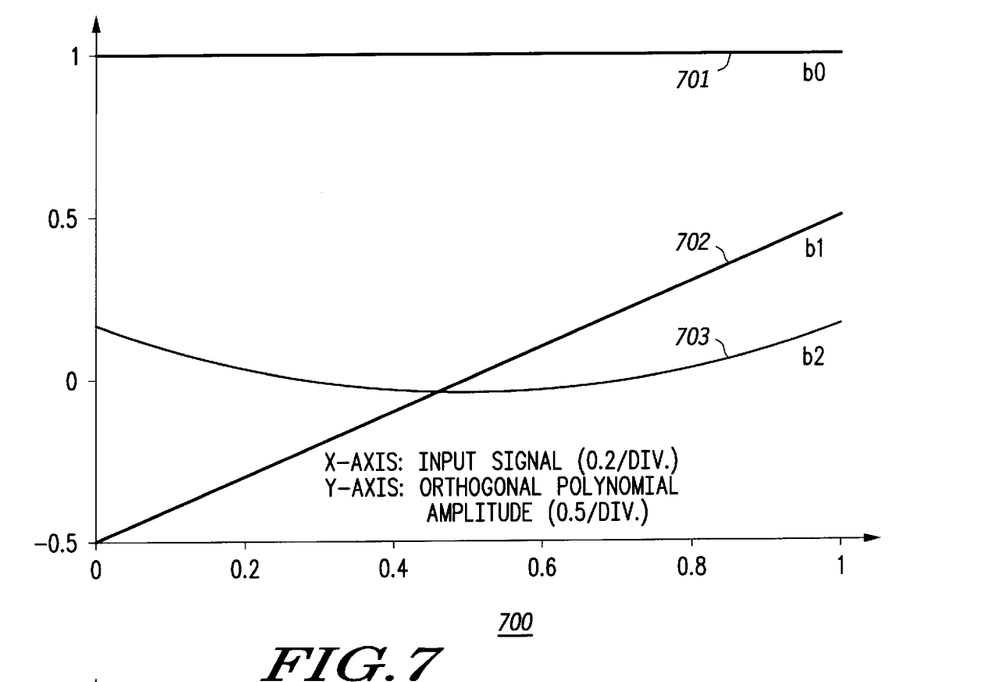
FIG. 7 is a graphical plot of one embodiment of the orthogonal polynomial basis functions.

The diagonal terms of the C matrix are chosen to be unity. Thus $b_0$ is unity and higher order terms are defined in terms of the C matrix. The C matrix is chosen such that the time average (Avg) of the product of any two basis functions is zero. In other words, the basis functions are mutually orthogonal for the given distribution of the input x. Thus, the basis function $b_1$ (702, FIG. 7) is defined by the fact that it is orthogonal to $b_0$ (701, FIG. 700):

$$Avg[b_0(x)b_1(x)] = Avg[(1)(x+c_{10})] = 0 \rightarrow c_{10} = -\bar{x}$$

Similarly, the basis function $b_2$ (703, FIG. 7) is defined by the fact that $b_2$ is orthogonal to $b_0$ (701) and $b_1$ (702). This procedure can be simplified further. The fact that the basis function $b_2$ (703) is orthogonal to $b_0$ (701) and $b_1$, (702) implies that $b_2$ (703) is orthogonal to all linear combinations of the two. Thus, $b_2$ (703) is orthogonal to all zeroth and first order polynomials. To evaluate the polynomial $b_2$ (703) is made orthogonal to 1 and x.

$$Avg[b_2(x)](1) = Avg[b_2(x)\,(x)] = Avg[x^2 + c_{21}x + c_{20}] = Avg[x^3 +_{21}x^2 + c_{20}x] = 0$$

In general, the basis function $b_i$ is orthogonal to 1, x, $x^2, \ldots, x^{i-1}$. This provides the i–1 equations to evaluate the (i–1) coefficients of $b_i$.

$$\left( Avg\left[ \sum_{j=0}^{i} c_{ij}(x)^{(j+k)} \right] = 0 \right) \text{ for } k = 0, 1, \ldots, i-1 \quad (5)$$

Consider an example where n=2 and x is uniformly distributed between 0 and 1. The basis functions are as follows.

$$b_0 = 1, b_1 = x - \tfrac{1}{2}$$

and $$b_2 = x^2 - x + \tfrac{1}{6} \quad (6)$$

FIG. 7, numeral 700, shows a plot of the basis functions. These basis functions were chosen for a uniform distribution of x between zero and unity. Note that the higher order basis functions are smaller in magnitude and have more variation. The basis functions are analogous to Fourier series where each term is orthogonal to all others.

Since y is a polynomial, y can be represented as a linear combination of the basis function polynomials as follows. The linear combination is not known at the outset and is written in terms of coefficients $g_i$ as follows.

$$y = \sum_{i=0}^{n-1} g_i(b_i(x)) \quad (7)$$

Computing the coefficients $g_i$ is equivalent to computing the coefficients $a_i$ since they are linearly related. A set of coefficients $h_i$ is assumed as the estimates of $g_i$ which are unknown. Thus, the estimated value of y is given by the following equation.

$$\overline{y} = \sum_{i=0}^{n-1} h_i(b_i(x)) \quad (8)$$

The coefficients $h_i$ are computed using the correlation between the error and the basis function. The orthogonal nature of the basis functions allows one to tune the coefficients independently. The control law is defined as follows.

$$\dot{h}_j = (e)b_j = (y - \overline{y})b_j = \left( \sum_{i=0}^{n-1} (g_i - h_i)b_i b_j \right) \quad (9)$$

In the integral form, the orthogonal nature of the basis functions may be used to show that the control law allows independent tuning in steady state. The inherent negative feedback nature of the tuning scheme is also apparent in the following approximation:

$$h_j(T) - h_j(0) = \int_0^T \left( \sum_{i=0}^{n-1} (g_i - h_i(t))b_i b_j \right) dt \approx \int_0^T (g_j - h_j(t))b_j^2 dt \quad (10)$$

The negative feedback nature of the control scheme suggests that the system is stable for arbitrary excitation and starting point. However, the proof of stability for this nonlinear system requires the second method of Liapunov.

Basis functions have been used in the prior art. However, when the orthogonality condition is not met, the system estimation becomes more complex than this algorithm.

Figure 8:
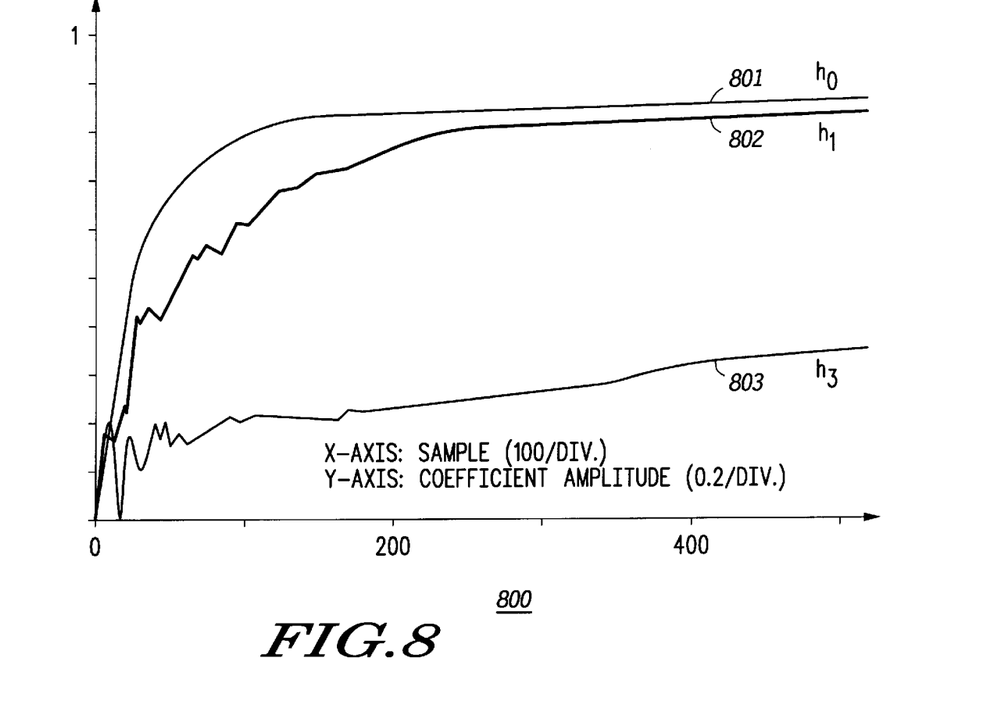
FIG. 8 is a graphical plot of a simulation of the convergence of the basis function weights.
Figure 9:
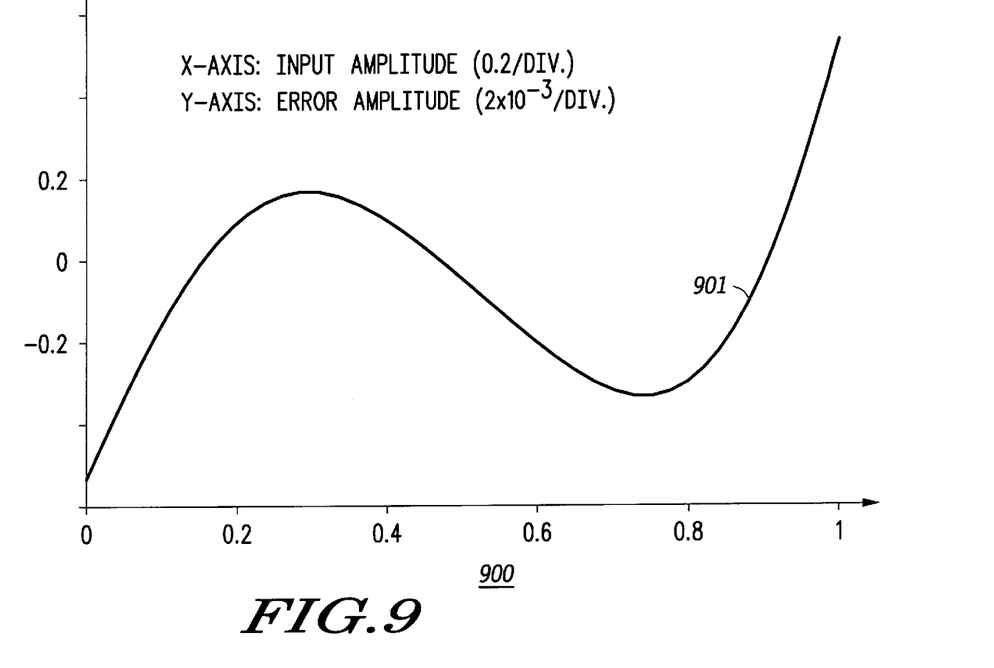
FIG. 9 is a graphical plot of a simulation showing the residual error.

This algorithm is used to estimate the nonlinearity of a transcendental function: for example, the exponentiation. Transcendental functions have an infinite polynomial representation. Thus, a finite order polynomial can only approximate such a function. FIG. 8, numeral 800, plots the coefficients $h_i$ ($h_0$-801, $h_1$-802, $h_2$-803) as they converge to their steady state value. FIG. 9, numeral 900, shows the error (901) in the estimation algorithm after convergence. Note that the error is very small and is uncorrelated to all the basis functions used.

Define a Liapunov function which is a sum of the squares of the error in each of the coefficients. This has a zero only at the desired equilibrium point and has a positive value everywhere else. It satisfies the criteria for being a valid Liapunov function.

$$V(\overline{h}) = \sum_{i=0}^{n-1} (g_i - h_i)^2 \quad (11)$$

The time derivative Liapunov function determines the stability of the system. If the time derivative is negative definite, then the system is stable in the large. If the time derivative is negative semi-definite, the system is stable provided that the Liapunov function does not vanish on any system trajectory. The time derivative of the Liapunov function is as follows.

$$\frac{dV}{dt} = \sum_{j=0}^{n-1} (g_j - h_j)(-\dot{h}_j) \quad (12)$$

$$= \sum_{j=0}^{n-1} (g_j - h_j) \sum_{i=0}^{n-1} (h_i - g_i) b_i b_j$$

$$= \sum_{j=0}^{n-1} \sum_{i=0}^{n-1} (g_i - h_i)(g_j - h_j) b_i b_j$$

The time derivative can be rewritten after regrouping as the square of a summation as follows.

$$\frac{dV}{dt} = -\left( \sum_{i=0}^{n-1} (g_i - h_i) b_i \right)^2 \quad (13)$$

This shows that the time derivative is negative semi-definite. To prove that the derivative does not vanish identically except at the desired operating point it is necessary to introduce some constraint on the tuning speed.

The definition of the control law for the coefficients $h_i$ involves a time constant that has been assumed to be unity for convenience. In practice it is chosen such that the coefficients $h_i$ change much more slowly compared to the input x and the basis functions $b_i$. This is defined to be slow tuning of the coefficients.

Consider the average value of the time derivative of the Liapunov function. Taking an average over a large time scale, the average value of the product of two dissimilar basis functions is zero.

$$Avg\left[ \frac{dV}{dt} \right] = -\left( \sum_{i=0}^{n-1} (g_i - h_i) b_i \right)^2 \approx -\left( \sum_{i=0}^{n-1} (g_i - h_i)^2 b_i^2 \right) \quad (14)$$

The average value of the time derivative of the Liapunov function is zero only at the origin. Thus, the derivative satisfies the criteria for Liapunov stability This is subject to the slow tuning criteria as defined earlier.

Consider a tuning scheme with n basis functions. The generation of the basis functions involves about $(n^2/2)$ adds and about $(n^2/2)$ multiplies. The updating of the coefficients requires n adds and n multiplications. The conversion from the weighting coefficients to the polynomial coefficients takes another $(n^2/2)$ adds and another $(n^2/2)$ multiplies. Thus the overall computation takes $(n^2+n)$ adds and $(n^2+n)$ multiplies. There are no divisions.

Computational complexity associated with the solution of a system of (n) simultaneous equations is of the order of the cube of the number of equations $(n^3/13)$. The choice of orthogonal basis functions results in a separation of the variables eliminates the need to solve a set of simultaneous equations.

This algorithm is an appropriate candidate for parallelization since there is little data dependency between the computation of the different coefficients. In a digital signal processor (DSP) implementation for an on-line estimation problem this is a useful feature.

System linearization is inherently more complex than system estimation. In the case of an RF power amplifier, system estimation is the procedure of estimating the nonlinearities of the amplifier. The system linearization would involve generating a transfer function that is the inverse of the nonlinearity. An obvious method for system linearization is to calculate the inverse of the estimated nonlinearity. The exact inverse of a finite polynomial results in an infinite series. It can be truncated, but with some loss of accuracy The present invention provides a more efficient way of performing system linearization that reduces the complexity of system linearization to that of system estimation. The predistortion is performed as a polynomial of the input signal. The predistorted signal (z) is obtained from the input signal (x).

$$z = \text{Poly}(x) \tag{15}$$

The predistorted signal is modulated and used as input to the RF power amplifier. The amplifier output is demodulated and results in the output signal (y). The same polynomial is operated on the output signal to create a new signal. $\tilde{z}$ $$\tilde{z} = \text{Poly}(y) \tag{16}$$

The polynomial coefficients are estimated such that the new signal (z) approaches the predistorted signal $\tilde{z}$. As the estimation converges, the nonlinearity is minimized.

$$z = \text{Poly}(x)$$

and $$z \approx \text{Poly}(y)$$

therefore $$x \approx y \tag{17}$$

This method of using a system estimation for system linearization is used successfully here to linearize an RF power amplifier. This method is equally applicable to other linearization problems.

The baseband signal associated with an RF signal is a complex variable (I+jQ) which needs special consideration. The basis functions of this complex variable are also complex. From the point of view of computation, this doubles the number of real variables. Also the envelope of the complex baseband signal $\sqrt{I^2+Q^2}$ is not available directly. Thus, the basis functions are constrained as follows.

$$b_1(I,Q)=I+jQ, b_3(I,Q)=(I+jQ)\{(I^2+Q^2)+C_{20}\} \tag{b 18}$$

$$b_5(I,Q)=(I+jQ)\{(I^2+Q^2)^2+C_{42}(I^2+Q^2)+C_{40}\} \tag{19}$$

More significantly, the product of the square of a complex basis function is not positive, but is complex, and may even have a negative real part. This requires a change in the estimation algorithm to accommodate the complex basis function.

The coefficients $h_i$ are computed using the correlation between the error and the basis function. The modified control law is defined as follows.

$$h_j = (e)b_j = (y-\bar{y})(bj)' = \left(\sum_{i=0}^{n-1}(g_i-h_i)b_i(b_j)'\right) \tag{20}$$

The inherent negative feedback nature of the tuning scheme is maintained for the complex case as is apparent in the following approximation.

$$h_j(T)-h_j(0) = \int_0^T \left(\sum_{i=0}^{n-1}(g_i-h_i(t))b_i(b_j)'\right)dt \tag{21}$$

$$\approx \int_0^T (g_j-h_j(t))|b_j|^2 dt$$

The negative feedback nature of the control scheme maintains stability for an arbitrary excitation and starting point.

Figure 10:
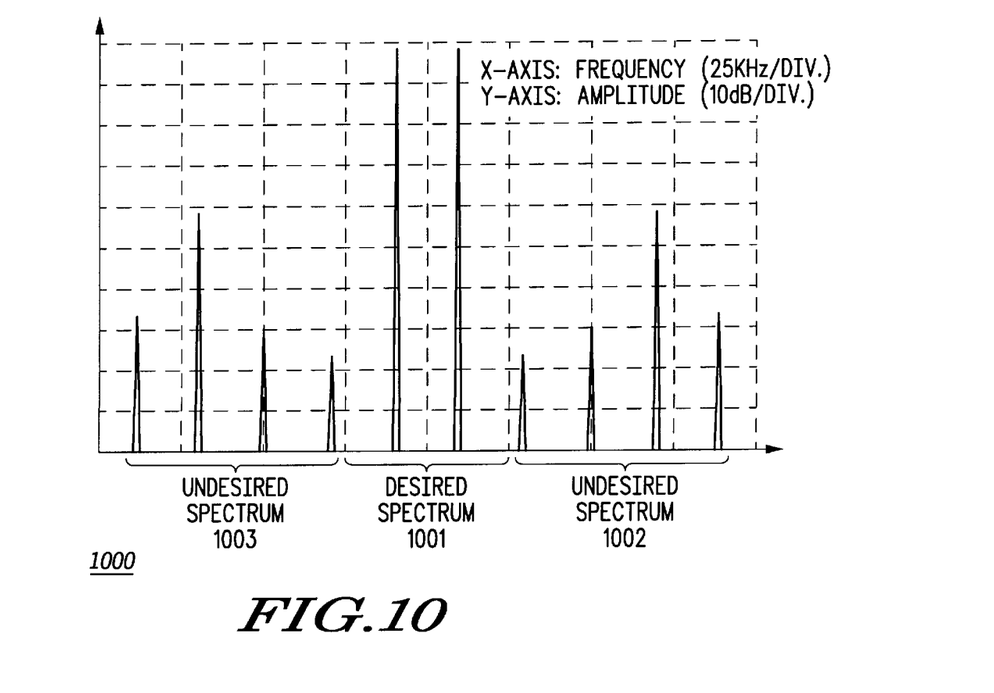
FIGS. 10 and 11 are representative spectrum plots of an amplified RF signal with and without predistortion, respectively.
Figure 11:
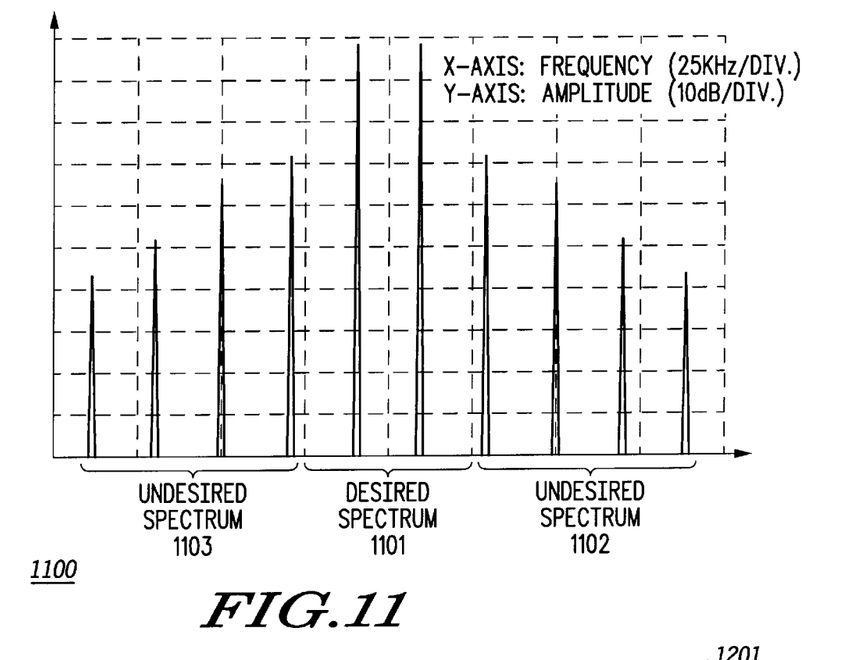

This method is tested successfully to linearize an RF power amplifier. FIG. 11, numeral 1100 (Undesired Spectrum 1102, 1103; Desired Spectrum 1101), shows the spectrum at the output of the RF power amplifier without linearization (predistortion). The input is a two tone signal which is a test signal of choice for RF power amplifiers. The odd intermodulation terms result in widening of the spectrum in the immediate neighborhood of the channel. This interferes with the adjacent channels and is undesirable. FIG. 10, numeral 1000 (Undesired Spectrum 1002, 1003; Desired Spectrum 1001), shows the spectrum with linearization (predistortion). In this case the number of basis functions is chosen to be three: the fundamental and terms corresponding to the third and fifth intermodulation terms. The spectrum corresponding to these terms is reduced by about 40 dB. Both the AM (Amplitude Modulation) to PM (Pulse Modulation) as well as AM to AM nonlinearity is compensated. There is no degradation in the spectrum for the uncompensated frequency band. Since the third and fifth intermodulation terms often dominate, this results in a highly desirable signal. The method of the present invention is general and may be used in a similar manner for any number of polynomial terms.

Figure 12:
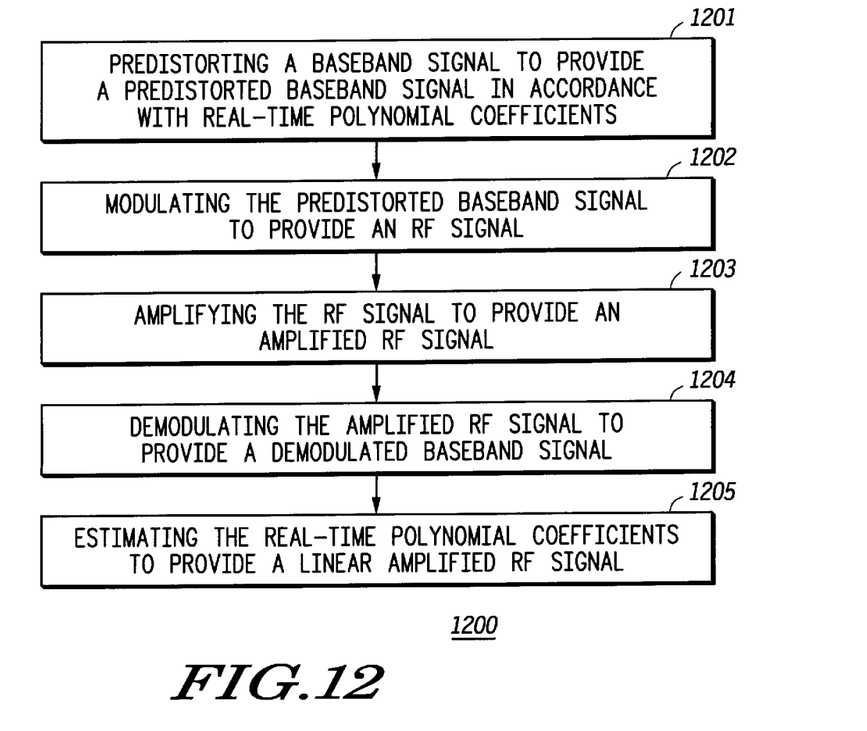
FIG. 12 is a flow chart showing one embodiment of a method in accordance with the present invention.

FIG. 12, numeral 1200, is a flow chart showing one embodiment of a method in accordance with the present invention. The method provides predistortion for linearization in a radio frequency RF power amplifier and includes the steps of: A) predistorting (1201) a baseband signal to provide a predistorted baseband signal in accordance with real-time polynomial coefficients; B) modulating (1202) the predistorted baseband signal to provide an RF signal; C) amplifying (1203) the RF signal to provide an amplified RF signal; D) demodulating (1204) the amplified RF signal to provide a demodulated baseband signal; and E) estimating (1205) the real-time polynomial coefficients to provide a linear amplified RF signal. In a preferred embodiment, the real-time polynomial coefficients are typically estimated using orthogonal polynomial basis functions.

Figure 13:
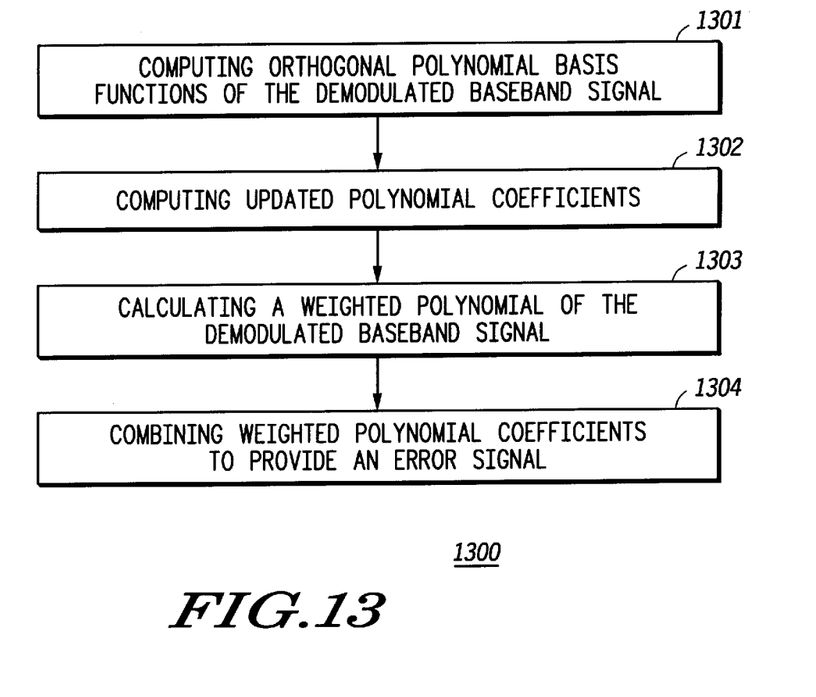
FIG. 13 is a flow chart showing one embodiment of the step of estimating the real-time polynomial coefficients shown in FIG. 12.
Figure 14:
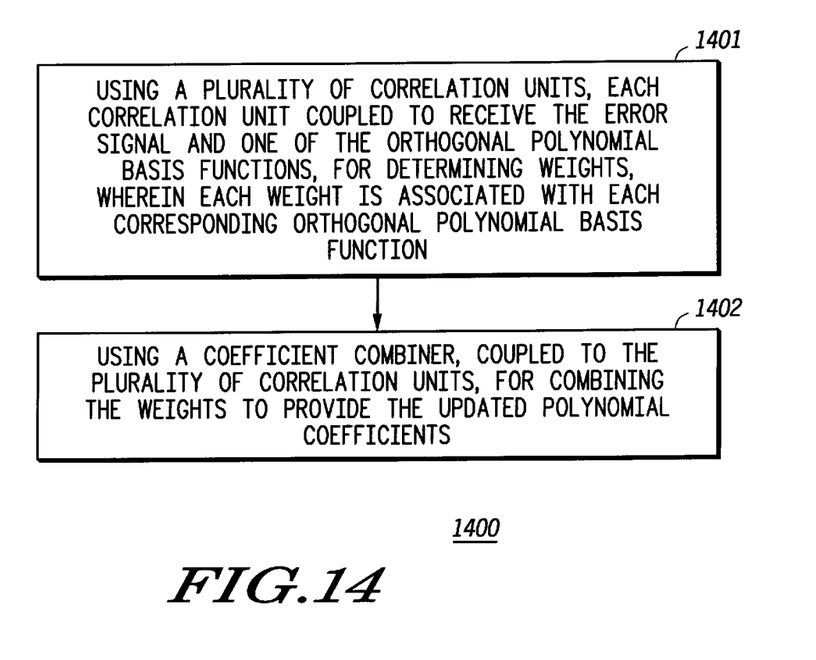
FIG. 14 is a flow chart showing another embodiment of the step of estimating the real-time polynomial coefficients shown in FIG. 12.

Generally, as shown in FIG. 13, numeral 1300, estimating the real-time polynomial coefficients may include:A) computing (1301) orthogonal polynomial basis functions of the demodulated baseband signal; B) computing (1302) updated polynomial coefficients; C) calculating (1303) a weighted polynomial of the demodulated baseband signal; and D) combining (1304) weighted polynomial coefficients to provide an error signal. As shown in FIG. 14, numeral 1400, estimating the real-time polynomial coefficients to provide a linear amplified RF signal may include: A) using (1401) a plurality of correlation units, each correlation unit coupled to receive the error signal and one of the orthogonal polynomial basis functions, for determining weights, wherein each weight is associated with each corresponding orthogonal polynomial basis function; and B) using (1402) a coefficient combiner, coupled to the plurality of correlation units, for combining the weights to provide the updated polynomial coefficients.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

I claim:

1. A device for providing predistortion for linearization in a radio frequency RF power amplifier, comprising:
    (A) a polynomial predistortion unit, coupled to receive an input baseband signal and updated polynomial coefficients, for predistorting the baseband signal to provide a predistorted baseband signal in accordance with the updated polynomial coefficients;
    (B) an RF modulator, coupled to the polynomial predistortion unit and to an RF generator, for modulating the predistorted baseband signal to provide an RF signal;
    (C) an RF power amplifier, coupled to the RF modulator and to a power supply, for amplifying the RF signal to provide an amplified RF signal;
    (D) an RF demodulator, coupled to receive the amplified RF signal, for demodulating the amplified RF signal to provide a demodulated baseband signal; and
    (E) a polynomial coefficient estimator, coupled to receive the predistorted baseband signal and the demodulated baseband signal, for estimating the polynomial coefficients using orthogonal polynomial basis functions and for providing the updated polynomial coefficients for the polynomial predistortion unit for substantially linearizing the amplified RF signal.

2. The device of claim 1 wherein voltage of the power supply is a function of the baseband signal.

3. A device for providing predistortion for linearization in a radio frequency RF power amplifier, comprising;
    (A) a polynomial predistortion unit, coupled to receive and input baseband signal and updated real-time polynomial coefficients, for predistorting the input baseband signal to provide a predistorted baseband signal in accordance with the updated real-time polynomial coefficients;
    (B) an RF modulator, coupled to the polynomial predistortion unit and to an RF generator, for modulating the predistorted baseband signal to provide an RF signal;
    (C) an RF power amplifier, coupled to the RF modulator and to a power supply, for amplifying the RF signal to provide an amplified RF signal;
    (D) an RF demodulator, coupled to receive the amplified RF signal, for demodulating the amplified RF signal to provide a demodulated baseband signal; and
    (E) a real-time polynomial coefficient estimator, coupled to receive the predistorted baseband signal and the demodulated baseband signal, for estimating the real-time polynomial coefficients using orthogonal polynomial basis functions and for providing the updated real-time polynomial coefficients that predistort the input baseband signal to adjust the amplified RF signal to be substantially linear.

4. The device of claim 3 wherein voltage of the power supply is a function of the input baseband signal.

5. The device of claim 3 wherein the real-time polynomial coefficient estimator includes:
    A) an orthogonal basis function calculator, coupled to receive the demodulated baseband signal, for computing orthogonal polynomial basis functions of the demodulated baseband signal;
    B) a polynomial coefficient update unit, coupled to the orthogonal basis function calculator and to receive an error signal, for computing updated polynomial coefficients;
    C) a weighted polynomial calculator, coupled to receive the demodulated baseband signal and to the polynomial coefficient update unit, for calculating a weighted polynomial of the demodulated baseband signal; and
    D) a combiner, coupled to the weighted polynomial calculator and to receive the predistorted baseband signal, for computing the error signal.

6. The device of claim 5 wherein the polynomial coefficient update unit includes:
    A) a plurality of correlation units, each correlation unit coupled to receive the error signal and one of the orthogonal polynomial basis functions, for determining weights, wherein each weight is associated with each corresponding orthogonal polynomial basis function, and
    B) a coefficient combiner, coupled to the plurality of correlation units, for combining the weights to provide the updated polynomial coefficients.

7. A method for providing predistortion for linearization in a radio frequency RF power amplifier, comprising the steps of:
    (A) predistorting a baseband signal to provide a predistorted baseband signal in accordance with real-time polynomial coefficients;
    (B) modulating the predistorted baseband signal to provide an RF signal;
    (C) amplifying the RF signal to provide an amplified RF signal;
    (D) demodulating the amplified RF signal to provide a demodulated baseband signal; and
    (E) estimating the real-time polynomial coefficients using orthogonal polynomial basis functions.

8. The method of claim 7 wherein estimating the real-time polynomial coefficients includes:
    A) computing orthogonal polynomial basis functions of the demodulated baseband signal;
    B) computing updated polynomial coefficients;
    C) calculating a weighted polynomial of the demodulated baseband signal; and D) combining weighted polynomial coefficients to provide an error signal.

9. The method of claim 7 wherein estimating the real-time polynomial coefficients to provide a linear amplified RF signal includes:
   A) using a plurality of correlation units, each correlation unit coupled to receive the error signal and one of the orthogonal polynomial basis functions, for determining weights, wherein each weight is associated with each corresponding orthogonal polynomial basis function; and
   B) using a coefficient combiner, coupled to the plurality of correlation units, for combining the weights to provide the updated polynomial coefficients.

10. A device for providing predistortion for linearization in a radio frequency RF power amplifier, comprising:
    (A) an envelope generator, coupled to receive and input baseband signal, for computing an envelope of the input baseband signal;
    (B) a polynomial predistorting unit, coupled to receive the input baseband signal, the envelope of the input baseband signal and updated polynomial coefficients, for predistorting the baseband signal to provide a predistorted baseband signal in accordance with the updated polynomial coefficients;
    (C) an RF modulator, coupled to the polynomial predistortion unit and to an RF generator, for modulating the predistorted baseband signal to provide an RF signal;
    (D) an RF power amplifier, coupled to the RF modulator and to a power supply, for amplifying the RF signal to provide an amplified RF signal;
    (E) an RF demodulator, coupled to receive the amplified RF signal, for demodulating the amplified RF signal to provide a demodulated baseband signal, and
    (F) a polynomial coefficient estimator, coupled to receive the predistorted baseband signal and the demodulated baseband signal, for estimating the polynomial coefficients using orthogonal polynomial basis functions and for providing the updated polynomial coefficients for the polynomial predistortion unit for substantially linearizing the amplified RF signal.

11. The device of claim 10 wherein voltage of the power supply is a function of the baseband signal.

12. A phone having a device for providing predistortion for linearization in a radio frequency RF power amplifier, the device comprising:
    (A) a polynomial predistortion unit, coupled to receive an input baseband signal and updated polynomial coefficients, for predistorting the baseband signal to provide a predistorted baseband signal in accordance with the updated polynomial coefficients;
    (B) an RF modulator, coupled to the polynomial predistortion unit and to an RF generator, for modulating the predistorted baseband signal to provide an RF signal;
    (C) an RF power amplifier, coupled to the RF modulator and to a power supply, for amplifying the RF signal to provide an amplified RF signal;
    (D) an RF demodulator, coupled to receive the amplified RF signal, for demodulating the amplified RF signal to provide a demodulated baseband signal; and
    (E) a polynomial coefficient estimator, coupled to receive the predistorted baseband signal and the demodulated baseband signal, for estimating the polynomial coefficients using orthogonal polynomial basis functions and for providing the updated polynomial coefficients for the polynomial predistortion unit for substantially linearizing the amplified RF signal.

13. The phone of claim 12 wherein voltage of the power supply is a function of the baseband signal.

14. A phone having a advice for providing predistortion for linearization in a radio frequency RF power amplifier, the device comprising:
    (A) a polynomial predistortion unit, coupled to receive an input baseband signal and updated real-time polynomial coefficients, for predistorting the input baseband signal to provide a predistorted baseband signal in accordance with the updated real-time polynomial coefficients;
    (B) an RF modulator, coupled to the polynomial predistortion unit and to an RF generator, for modulating the predistorted baseband signal to provide and RF signal;
    (C) an RF power amplifier, coupled to the RF modulator and to a power supply, for amplifying the RF signal to provide an amplified RF signal;
    (D) an RF demodulator, coupled to receive the amplified RF signal, for demodulating the amplified RF signal to provide a demodulated baseband signal; and
    (E) a real-time polynomial coefficient estimator, coupled to receive the predistorted baseband signal and the demodulated baseband signal, for estimating the real-time polynomial coefficients using orthogonal polynomial basis functions and for providing the updated real-time polynomial coefficients that predistort the input baseband signal to adjust the amplified RF signal to be substantially linear.

15. The phone of claim 14 wherein voltage of the power supply is a function of the input baseband signal.

16. The phone of claim 14 wherein the real-time polynomial coefficient estimator includes:
    A) an orthogonal basis function calculator, coupled to receive the demodulated baseband signal, for computing orthogonal polynomial basis functions of the demodulated baseband signal;
    B) a polynomial coefficient update unit, coupled to the orthogonal basis function calculator and to receive an error signal, for computing updated polynomial coefficients;
    C) a weighted polynomial calculator, coupled to receive the demodulated baseband signal and to the polynomial coefficient update unit, for calculating a weighted polynomial of the demodulated baseband signal; and
    D) a combiner, coupled to the weighted polynomial calculator and to receive the predistorted baseband signal, for computing the error signal.

17. The phone of claim 16 wherein the polynomial coefficient update unit includes:
    A) a plurality of correlation units, each correlation unit coupled to receive the error signal and one of the orthogonal polynomial basis functions, for determining weights, wherein each weight is associated with each corresponding orthogonal polynomial basis function, and
    B) a coefficient combiner, coupled to the plurality of correlation units, for combining the weights to provide the updated polynomial coefficients.

18. A base station having a device for providing predistortion for linearization in a radio frequency RF power amplifier, the device comprising:
    (A) a polynomial predistortion unit, coupled to receive an input baseband signal and updated polynomial coefficients, for predistorting the baseband signal to provide a predistorted baseband signal in accordance with the updated polynomial coefficients;

(B) an RF modulator, coupled to the polynomial predistortion unit and to an RF generator, for modulating the predistorted baseband signal to provide an RF signal;

(C) an RF power amplifier, coupled to the RF modulator and to a power supply, for amplifying the RF signal to provide an amplified RF signal;

(D) an RF demodulator, coupled to receive the amplified RF signal, for demodulating the amplified RF signal to provide a demodulated baseband signal; and (E) a polynomial coefficient estimator, coupled to receive the predistorted baseband signal and the demodulated baseband signal, for estimating the polynomial coefficients using orthogonal polynomial basis functions and for providing the updated polynomial coefficients for the polynomial predistortion unit for substantially linearizing the amplified RF signal.

19. The base station of claim 18 wherein voltage of the power supply is a function of the baseband signal.

20. A base station having a device for providing predistortion for linearization in a radio frequency RF power amplifier, the device comprising;

(A) a polynomial predistortion unit, coupled to receive an input baseband signal and updated real-time polynomial coefficients, for predistorting the input baseband signal to provide a predistorted baseband signal in accordance with the updated real-time polynomial coefficients;

(B) an RF modulator, coupled to the polynomial predistortion unit and to an RF generator, for modulating the predistorted baseband signal to provide and RF signal;

(C) an RF power amplifier, coupled to the RF modulator and to a power supply, for amplifying the RF signal to provide an amplified RF signal;

(D) an RF demodulator, coupled to receive the amplified RF signal, for demodulating the amplified RF signal to provide an demodulated baseband signal; and (E) a real-time polynomial coefficient estimator, coupled to receive the predistorted baseband signal and the demodulated baseband signal, for estimating the real-time polynomial coefficients using orthogonal polynomial basis functions and for providing the updated real-time polynomial coefficients that predistort the input baseband signal to adjust the amplified RF signal to be substantially linear.

21. The base station of claim 20 wherein voltage of the power supply is a function of the input baseband signal.

22. The base station of claim 20 wherein the real-time polynomial coefficient estimator includes:

A) an orthogonal basis function calculator, coupled to receive the demodulated baseband signal, for computing orthogonal polynomial basis functions of the demodulated baseband signal;

B) a polynomial coefficient update unit, coupled to the orthogonal basis function calculator and to receive an error signal, for computing updated polynomial coefficients;

C) a weighted polynomial calculator, coupled to receive the demodulated baseband signal and to the polynomial coefficient update unit, for calculating a weighted polynomial of the demodulated baseband signal; and D) a combiner, coupled to the weighted polynomial calculator and to receive the predistorted baseband signal, for computing the error signal.

23. The base station of claim 22 wherein the polynomial coefficient update unit includes:

A) a plurality of correlation units, each correlation unit coupled to receive the error signal and one of the orthogonal polynomial basis functions, for determining weights, wherein each weight is associated with each corresponding orthogonal polynomial basis function, and B) a coefficient combiner, coupled to the plurality of correlation units, for combining the weights to provide the updated polynomial coefficients.

* * * * *